US008387598B2

(12) United States Patent
Gillberg et al.

(10) Patent No.: US 8,387,598 B2
(45) Date of Patent: Mar. 5, 2013

(54) IGNITION SYSTEM OPEN SECONDARY DETECTION

(75) Inventors: James Edward Gillberg, Flemington, NJ (US); Jack Edward Wojslawowicz, Bayonne, NJ (US)

(73) Assignee: Fairchild Semiconductor Corporation, San Jose, CA (US)

( * ) Notice: Subject to any disclaimer, the term of this patent is extended or adjusted under 35 U.S.C. 154(b) by 739 days.

(21) Appl. No.: 12/535,597

(22) Filed: Aug. 4, 2009

(65) Prior Publication Data
US 2011/0031979 A1   Feb. 10, 2011

(51) Int. Cl.
*F02F 3/00* (2006.01)
*H01F 38/12* (2006.01)
(52) U.S. Cl. ........ 123/634; 123/605; 123/618; 361/247; 324/380
(58) Field of Classification Search .................. 123/601, 123/605, 618, 634, 655, 656; 324/378, 546, 324/380, 388; 361/247
See application file for complete search history.

(56) References Cited

U.S. PATENT DOCUMENTS

| 4,913,123 | A | * | 4/1990 | DeBiasi et al. ........... 123/406.19 |
| 4,969,443 | A | * | 11/1990 | DeBiasi ........................ 123/481 |
| 5,019,779 | A | * | 5/1991 | Ookawa ........................ 324/388 |
| 5,226,394 | A | | 7/1993 | Shimasaki et al. |
| 5,397,964 | A | * | 3/1995 | Edwards .................... 315/209 T |
| 5,598,821 | A | | 2/1997 | Terata et al. |
| 2006/0152865 | A1 | | 7/2006 | Nair et al. |

OTHER PUBLICATIONS

Gillberg, Jim, et al., "Advances in Automotive Ignition Devices", *Power Systems Design Europe*, (Sep. 2005), 3 pgs.

\* cited by examiner

*Primary Examiner* — Hai Huynh
(74) *Attorney, Agent, or Firm* — Schwegman, Lundberg & Woessner, P.A.

(57) ABSTRACT

This document discusses, among other things, a system and method for detecting an open secondary condition in a secondary coil of an ignition coil using a control signal received from a control input of a switch configured to control the flow of current to a primary coil of the ignition coil. In an example, the flow of current in the primary coil of the ignition coil can be controlled using an insulated gate bipolar junction transistor (IGBT), and the open secondary condition in the secondary coil of the ignition coil can be detected using a received gate voltage of the IGBT.

29 Claims, 6 Drawing Sheets

IGNITION SYSTEM OPEN SECONDARY DETECTION

TECHNICAL FIELD

This document pertains generally to open secondary detection, and more particularly, but not by way of limitation, to ignition system open secondary detection.

BACKGROUND

Force in an internal combustion engine is typically produced by igniting fuel, using an ignition system, in a combustion chamber. The type of ignition system depends on the type of engine. For example, a diesel engine can be ignited using compression heating, while a petrol or gasoline engine can be ignited using a spark (e.g., from an igniter, or a spark plug).

Generally, to generate a spark to ignite a gasoline engine, ignition systems include a power source (e.g., a battery), a transformer (e.g., an ignition coil), a switch (e.g., to control a current in a primary coil of the transformer), and an igniter. Because a voltage across an inductor (or a coil) is proportionate to a change in current in the inductor ($V(t)=di(t)/dt$), an immediate change in current through a primary winding of the inductor can produce a high voltage. An ignition coil typically includes a primary coil and a secondary coil. Generally, the voltage on the secondary coil is proportionate to the voltage on the primary coil, amplified by a ratio of turns between the primary and secondary coils. In certain examples, the voltage on the secondary coil can approach 10-20 kilovolts, which, once generated, is impressed across a gap on the igniter. Once the voltage across the gap exceeds the dielectric constant of the air in the vicinity of the gap, a spark is produced across the gap, igniting fuel (e.g., a gasoline-air mixture) in the combustion chamber.

Over time, the switch has evolved from a mechanical switch (e.g., breaker points in a distributor), to a high voltage Darlington bipolar transistor either in the distributor or in a separate electronic control module, and now to an insulated gate bipolar transistor (IGBT) in an ignition coil proximate the spark plug.

OVERVIEW

The present inventors have recognized, among other things, that an open secondary condition can be detected in a secondary coil of an ignition coil using a control signal received from a control input of a switch configured to control the flow of current to a primary coil of the ignition coil. In an example, the flow of current in the primary coil of the ignition coil can be controlled using an insulated gate bipolar junction transistor (IGBT), and the open secondary condition in the secondary coil of the ignition coil can be detected using a received gate voltage of the IGBT.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In certain examples, in an ignition system, an igniter (or spark plug) can fail to create a spark (e.g., due to a poor connection between an ignition coil and the spark plug, an improper spark plug gap, buildup on the spark plug, improper fuel mixture in a combustion chamber, etc.). In these examples, energy remains in a secondary coil of the ignition coil, which in turn induces energy back to a primary coil of the ignition coil and a switch (e.g., a coil driving switch, such as an IGBT, which controls the flow current in the primary coil). Accordingly, the energy handling requirements of the switch (and in turn, the size and cost of the switch) are generally high to protect the switch from damage during an open secondary condition.

In an example, to dissipate energy in the primary coil, the ignition system can include a zener circuit configured to provide a control signal to the switch to dissipate energy in the switch when the voltage in the primary coil reaches a certain threshold. However, during operation in an open secondary condition, this energy must be dissipated during each attempted ignition cycle (e.g., hundreds of times per minute).

In many examples, the single pulse energy rating of a switch can be much higher than the repetitive pulse energy rating. Thus, by detecting the open secondary condition, and inhibiting an attempted ignition during the open secondary condition, excess power dissipation in the switch can be avoided, significantly reducing the energy handling requirements of the switch, allowing a smaller and less costly switch to be utilized.

In certain examples, to detect an open secondary condition, the voltage in the primary coil can be sensed by receiving a voltage at a collector of an IGBT or by measuring the primary coil current decay. However, the voltage at the collector of the IGBT during an open secondary condition often exceeds 400 volts (e.g., 350-600 volts), and the current can be in the order of 8 to 10 Amperes. Monitoring voltage or current at such levels can require large and costly components, increasing both the size and the cost of the overall system.

The present inventors have recognized, among other things, that by monitoring the control signal at the control input of the switch (e.g., by monitoring a gate voltage on an IGBT), the open secondary condition can detected with less complexity and with a lower cost.

In many existing switches, monitoring the control signal at the control input of the switch can be difficult, as existing switches often include an internal resistor at the control input (e.g., an internal gate resistor) that can mask the actual control signal at the control input. Thus, in certain examples, the present inventors have recognized that, to detect the open secondary condition, the control signal can be monitored at the control input of the switch (e.g., directly at the control input of the switch), before any internal resistor.

Figure 1:
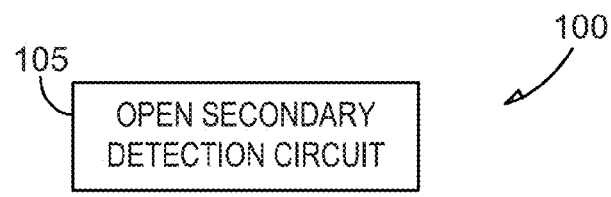
FIG. 1 illustrates generally an example of a system including an open secondary detection circuit.

FIG. 1 illustrates generally an example of a system 100 including an open secondary detection circuit 105 configured to receive a control signal from a control input of a switch and to detect an open secondary condition in a secondary coil of an ignition coil using the received control signal. In an example, the secondary coil of the ignition coil can be configured to provide energy to an igniter (or spark plug) of a non-diesel or gasoline internal combustion engine.

Figure 2:
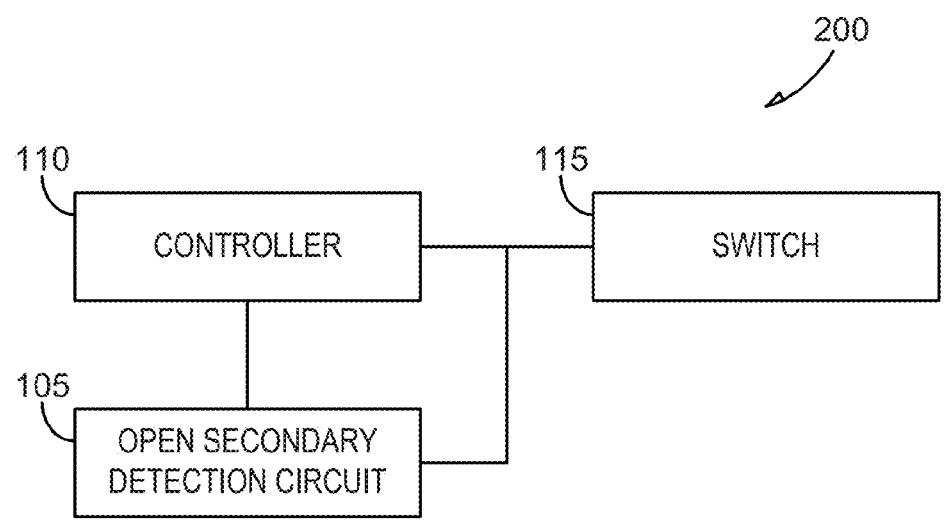
FIG. 2 illustrates generally an example of a system including an open secondary detection circuit, a controller, and a switch.

FIG. 2 illustrates generally an example of a system 200 including an open secondary detection circuit 105, a controller 110, and a switch 115.

In certain examples, the controller 110 can include a switch controller or control circuit, a transistor driver, a processor, or one or more other controllers configured to provide a control signal (e.g., a voltage) to, or otherwise control, the switch 115. In an example, the controller 110 can be configured to provide the control signal to the control input of the switch 115, for example, to control a flow of current in a primary coil of an ignition coil.

In an example, the switch 115 can include a transistor, such as an IGBT, and can be configured to control a flow of current to the primary coil of the ignition coil. The switch can include a control input configured to receive a control signal. In an example, the control input can include a gate of the transistor (e.g., a gate of an IGBT), and the control signal can include a voltage. In other examples, the switch 115 can include one or more other transistors, such as a metal-oxide-semiconductor field-effect-transistor (MOSFET), a bipolar junction transistor (BJT) (e.g., a bipolar Darlington transistor), etc.

In the example of FIG. 2, the open secondary detection circuit 105 can be configured to receive the control signal from the control input of the switch 115 (e.g., to receive a voltage from a gate of a transistor, such as an IGBT) and to detect an open secondary condition in a secondary coil of an ignition coil using the received control signal. For example, the open secondary detection circuit 105 can be configured to detect the open secondary condition in the secondary coil of the ignition coil if the received control signal (e.g., a gate voltage of the transistor) remains above an open secondary threshold for a predetermined time threshold.

In certain examples, the open secondary detection circuit 105 can be configured to provide an open secondary signal to the controller 110. For example, the open secondary detection circuit 105 can be configured to provide an open secondary signal to the controller if an open secondary condition is detected, and the controller 110 can be configured to inhibit the flow of current through the switch 115 in response to receiving the open secondary signal.

In an example, the open secondary detection circuit 105, the controller 110, and the switch 115 can be included in a single integrated package.

Figure 3:
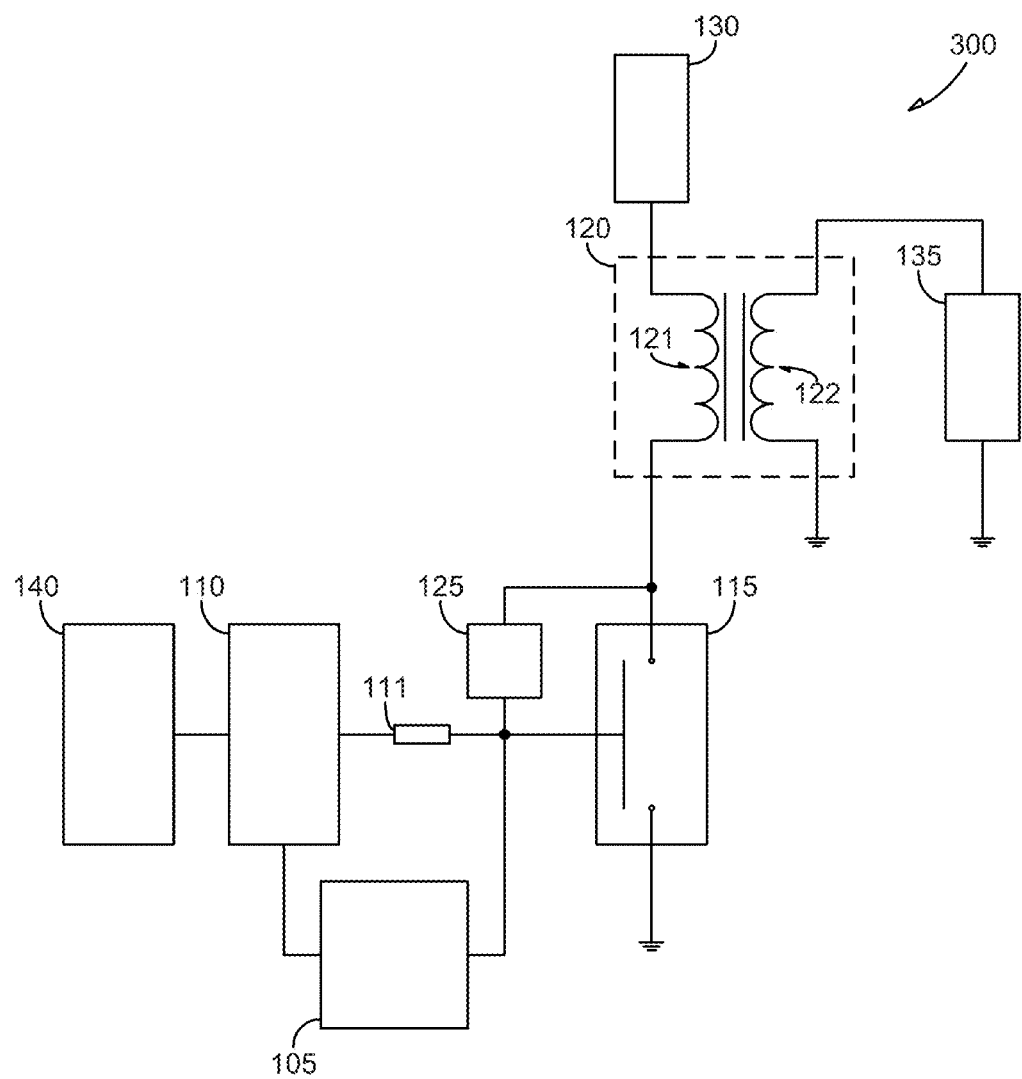
FIG. 3 illustrates generally an example of an ignition system.

FIG. 3 illustrates generally an example of an ignition system 300. To generate or provide an ignition spark, the ignition system 300 includes a battery 130 (or other power source), an ignition coil 120 (including a primary coil 121 and a secondary coil 122), an igniter (or spark plug) 135, and a switch 115. Generally, the switch 115 is configured to provide a change in current through the primary coil 121 of the ignition coil 120, producing a voltage (e.g., higher than a voltage of the battery 130) in the primary coil 121. The voltage in the primary coil 121 generates a higher voltage in the secondary coil 122 (e.g., by a ratio of turns between the primary coil 121 and the secondary coil 122). The voltage in the secondary coil can be provided to the igniter 135, which in turn provides an ignition spark to a fuel mixture. In this example, the ignition system 300 further includes an open secondary detection circuit 105, a controller 110, a clamp circuit 125, an engine control unit (ECU) 140, and a resistor 111 between the control input (e.g., a gate of a transistor) and the controller 110. In other examples, the resistor 111, or one or more other resistors, can be located between the control input and the open secondary detection circuit 105, or between the control input and the clamp circuit 125.

In an example, the controller 110 can be coupled to the engine control unit (ECU) 140 and to the switch 115 (e.g., through the resistor 111). In an example, the ECU 140 can be configured to control various aspects of engine operation, including the ignition spark timing. In an example, the controller 110 can be configured to receive instruction from the ECU 140 and can be configured to provide a control signal to a control input of the switch 115.

In the example of FIG. 3, the switch 115 can be configured to control a flow of current to the primary coil 121 from the battery 130. In certain examples, the switch 115 can include a transistor, such as an IGBT, having a gate, a collector, and an emitter. In an example, the control input of the switch 115 can include the gate of the transistor, and the control signal can include a voltage. In certain examples, the controller 110 or one or more other devices can provide a voltage to the gate of the transistor to allow current to flow between the collector and the emitter, providing a current to the primary coil 121 of the ignition coil 120.

In an example, a voltage can be generated in the secondary coil 122 proportionate to the voltage in the primary coil 121, amplified by a ratio of turns between the primary coil 121 and the secondary coil 122. The voltage in the secondary coil 122 can be provided to the igniter 135, configured to provide an ignition spark. In an example, an open secondary condition exists when, absent ignition spark, the energy transferred to the secondary coil 122 remains, and, as a result, generates a voltage on the primary coil 121, seen by the switch 115.

In an example, during an open secondary condition, energy in the ignition coil 120 can be dissipated using the clamp circuit 125. In an example, the clamp circuit 125 can be configured to receive an indication of energy (e.g., a voltage) in the primary coil 121. If the received indication of energy is indicative of an open secondary condition (e.g., if the received indication of energy meets or exceeds a clamp voltage threshold), the clamp circuit 125 can be configured to provide a control signal to the control input of the switch 115 (e.g., a voltage to turn on the switch 115) to dissipate energy stored in the ignition coil 120.

In certain examples, the clamp circuit 125 can include a zener circuit having at least one zener diode, arranged to provide a voltage to turn on the switch 115 (in certain examples, 2.5V, 3V, etc.) if the energy in the primary coil 121 meets or exceeds the clamp voltage threshold. In an example, the clamp voltage threshold can include a voltage between approximately 350 and 600 volts (e.g., typically 400 volts).

In an example, the open secondary detection circuit 105 can be configured to receive the control signal at or from the control input of the switch 115. In an example, the control signal can be provided using the controller 110, or using the clamp circuit 125. In an example, the controller 110 can include at least a portion of the open secondary detection circuit 105. In an example, the open secondary detection circuit 105 can be configured to receive the control signal (e.g., a gate voltage) through or after the resistor 111. In other examples, the open secondary detection circuit 105 can be configured to receive the control signal (e.g., the gate voltage) directly from the control input (e.g., the gate), and not through the resistor 111.

In an example, at least one of the open secondary detection circuit 105 or the controller 110 can be configured to provide an indication of a detected open secondary condition to the ECU 140.

Figure 4:
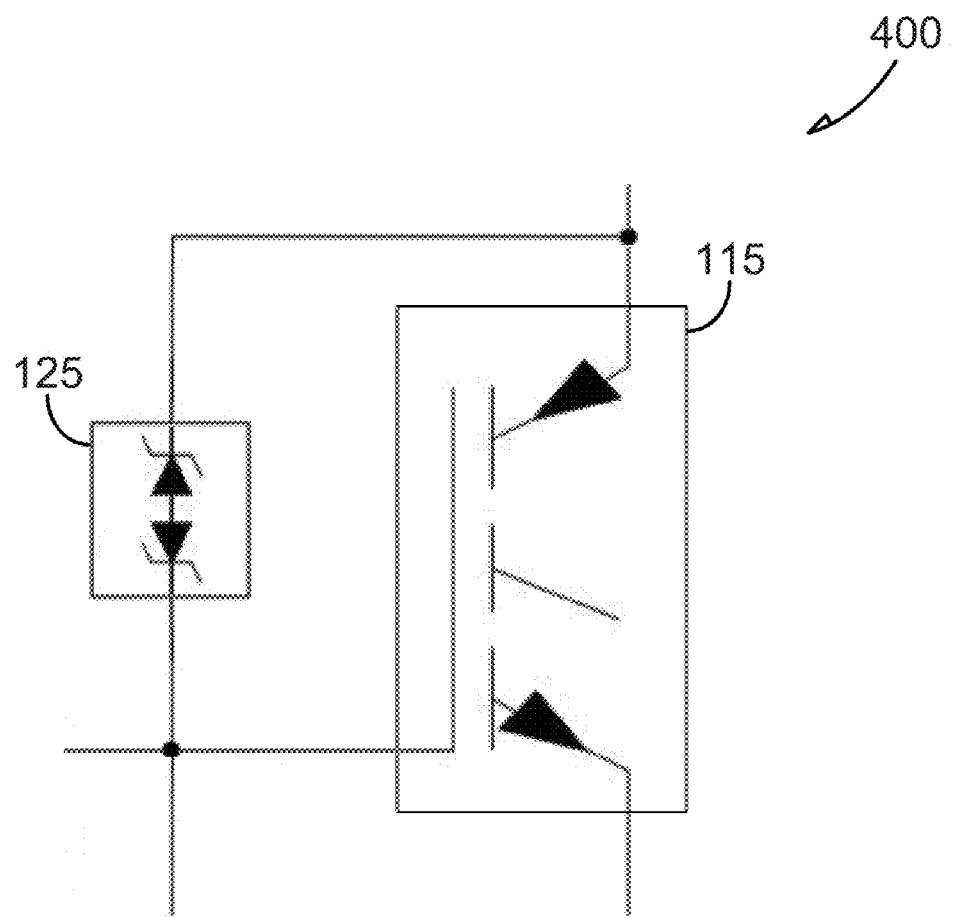
FIG. 4 illustrates generally an example of a switch and a clamp circuit.

FIG. 4 illustrates generally an example of a switch 115 and a clamp circuit 125. In an example, the switch 115 can include an insulated gate bipolar transistor (IGBT) 115 having a gate, a collector, and an emitter. Further, the clamp circuit 125 can include a zener circuit including one or more zener diodes.

Figure 5A:
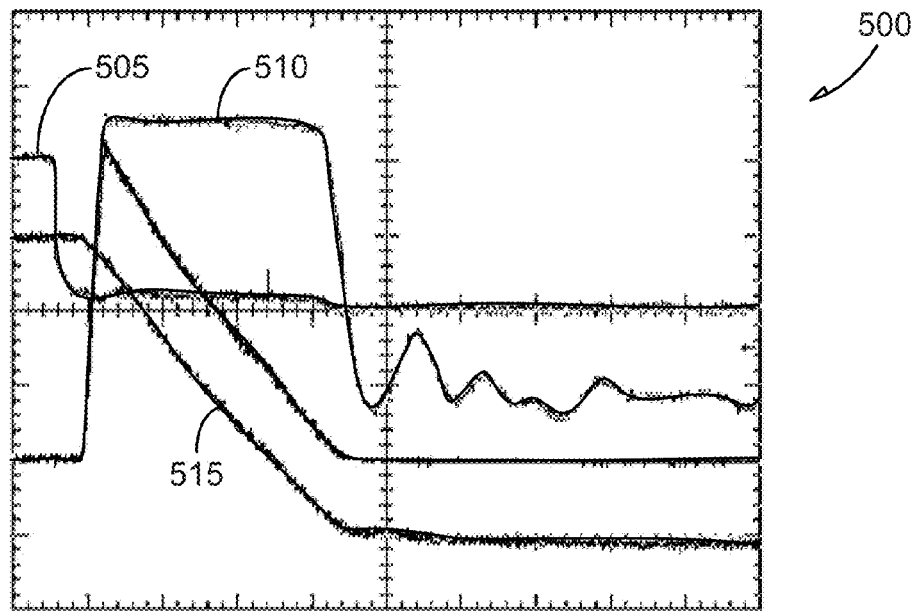
FIGS. 5A and 5B illustrate generally examples of a relationship between a gate voltage, a collector voltage, and a collector current in an IGBT during normal and open secondary ignition coil operation.
Figure 5B:
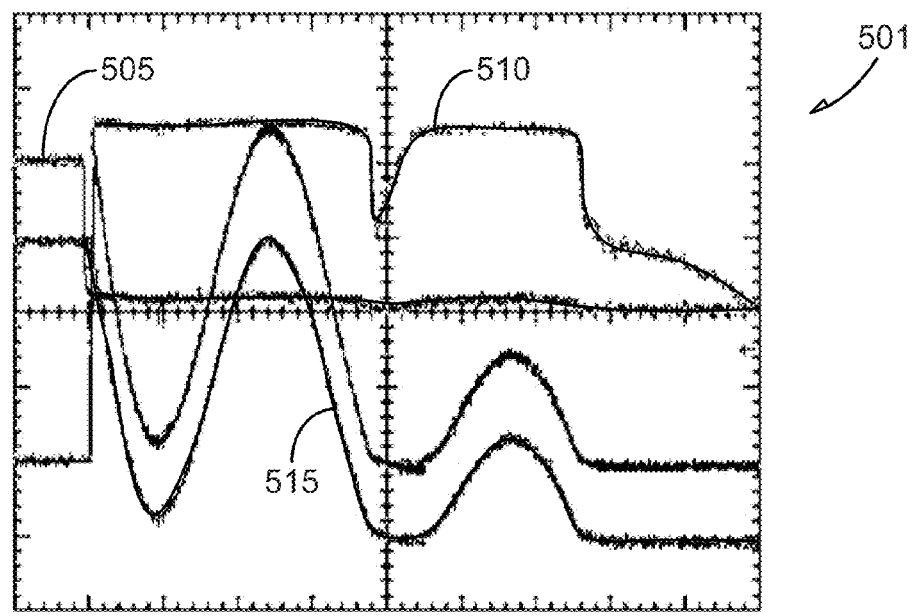

FIG. 5A illustrates generally an example of a relationship 500 between a gate voltage 505, a collector voltage 510, and a collector current 515 in an IGBT during normal ignition coil operation, firing an igniter or spark plug. FIG. 5B illustrates generally an example of a relationship 501 between a gate voltage 505, a collector voltage 510, and a collector current 515 in an IGBT during open secondary ignition coil operation.

In the example of FIG. 5A, during normal ignition coil operation, the IGBT remains in a self-clamped inductive switching (SCIS) mode for approximately 7 microseconds. The SCIS mode includes an operational mode of the IGBT where the part is turned on into a high voltage high current active mode. With an inductive load, the collector voltage can rise to a high level until a zener circuit connected between the collector and the gate supplies sufficient gate voltage to turn on the IGBT, clamping the collector level. In the example of FIG. 5B, during open secondary coil operation, the IGBT remains in the SCIS mode for approximately 66 microseconds. In an example, the open secondary condition can be detected using the SCIS time. In other examples, the open secondary condition can be detected using the collector voltage 510, or the decay of the collector current 515. However, each of the collector voltage 510 and the collector current 515 can be difficult to monitor.

In an example, the present inventors have recognized, among other things, that the open secondary condition can be detected by monitoring the gate voltage 505 at a time after normal operation of the IGBT has ended (e.g., 20 microseconds).

Figure 6:
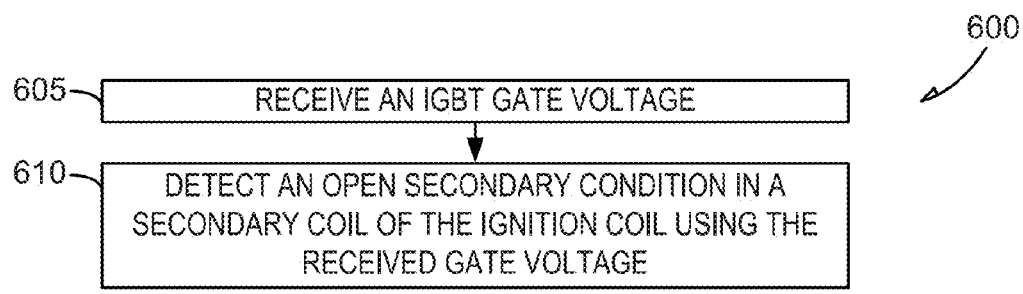
FIG. 6 illustrates generally an example of a method including detecting an open secondary condition in a secondary coil of an ignition coil using a received gate voltage.

FIG. 6 illustrates generally an example of a method 600 including detecting an open secondary condition in a secondary coil of an ignition coil using a received gate voltage.

At 605, an IGBT gate voltage is received. In an example, the gate voltage can be received using an open secondary detection circuit.

At 610, an open secondary condition can be detected in a secondary coil of the ignition coil using the received gate voltage. In an example, the open secondary condition can be detected if the received gate voltage remains above an open secondary threshold for a predetermined time threshold. In an example, the open secondary threshold can include a voltage of approximately 3 volts (or one or more other voltages configured to turn on a transistor (e.g., IGBT)). Further, the predetermined time threshold can include a time of approximately 20 microseconds (or one or more other times indicative of an open secondary condition (e.g., greater than 7 microseconds, etc.)).

In other examples, one or more other control signals for a switch can be received, and the open secondary condition can be detected using the one or more other control signals for the switch.

Figure 7:
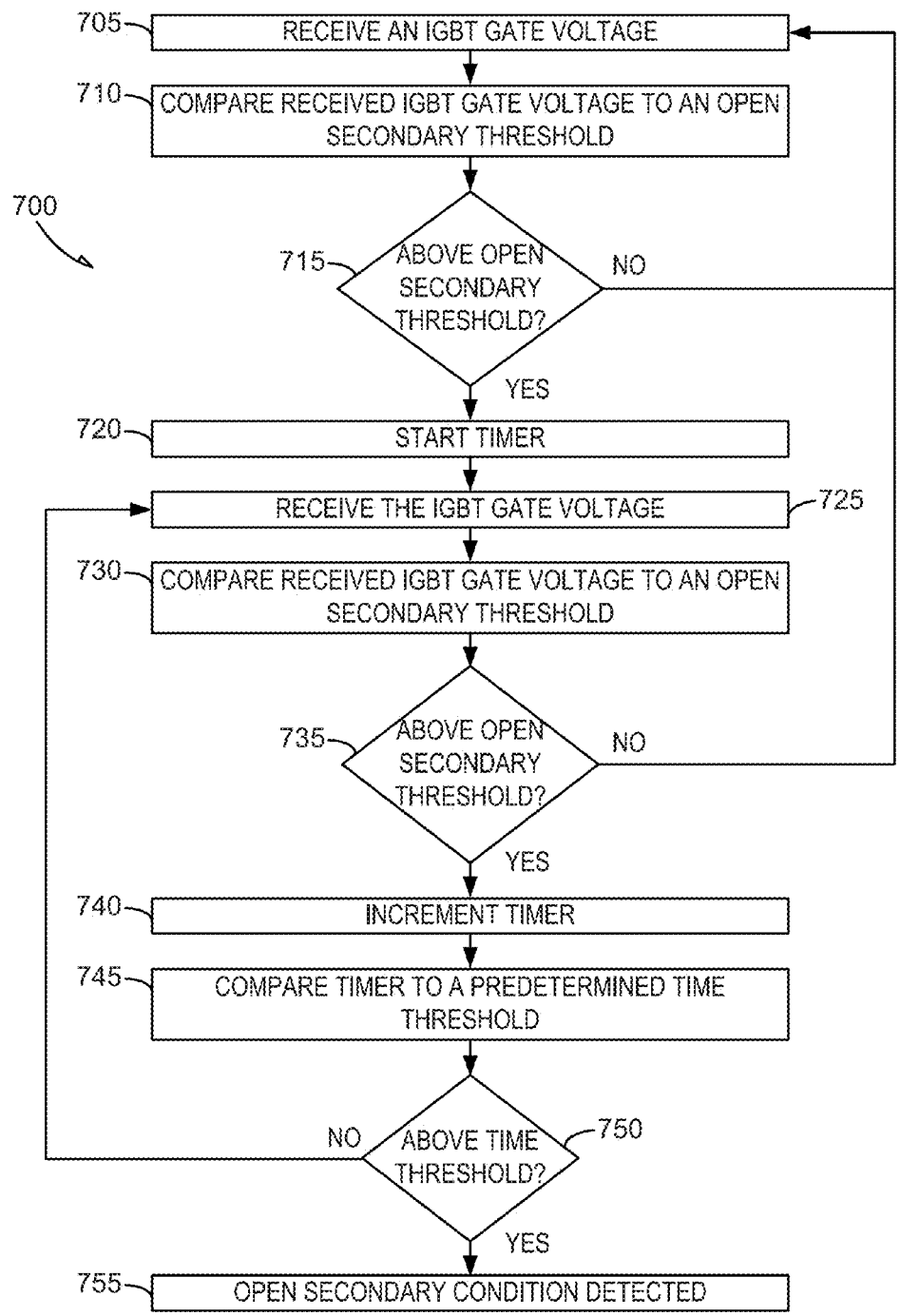
FIG. 7 illustrates generally an example of a method including detecting an open secondary condition in a secondary coil of an ignition coil.

FIG. 7 illustrates generally an example of a method 700 including detecting an open secondary condition in a secondary coil of an ignition coil.

At 705, an IGBT gate voltage is received. At 710, the received IGBT gate voltage is compared to an open secondary threshold. In an example, the received IGBT gate voltage can be compared using a comparator. In certain examples, the open secondary threshold can indicate that the IGBT is on.

At 715, if the received IGBT gate voltage is above the open secondary threshold, then, at 720, a timer is started. If, at 715, the received IGBT gate voltage is not above the open secondary threshold, process flow returns to 705.

At 720, a timer is started. In other examples, one or more other delay circuits can be triggered, configured to determine if the ignition coil is in an open secondary condition, or in normal operation.

At 725, the IGBT gate voltage is received. At 730, the received IGBT gate voltage is compared to the open secondary threshold.

At 735, if the received IGBT gate voltage is above the open secondary threshold, then, at 740, the timer is incremented. If, at 735, the received IGBT gate voltage is not above the open secondary threshold, process flow returns to 705.

At 740, the timer is incremented. In other examples, one or more other delay circuits can be checked, started, incremented, etc., to determine if the ignition coil is in the open secondary condition.

At 745, the timer is compared to a predetermined time threshold. In an example, the timer can be compared to the predetermined time threshold using a comparator, or one or more delay circuits. In an example, the predetermined time threshold can indicate that the IGBT has remained on past the normal operation time, indicating an open secondary condition.

At 750, if the timer is above the predetermined time threshold, then, at 755, the open secondary condition is detected. If, at 750, the timer is not above the predetermined time threshold, process flow continues to 725.

At 755, the open secondary condition is detected. In certain examples, the open secondary condition can be provided to a controller or an ECU. In an example, the controller can be configured to inhibit current to the primary coil of the ignition coil. Further, the controller or the ECU can be configured to provide an alert to a user that the open secondary condition has been detected.

Other Examples

In an example, after an open secondary condition has been detected, the controller can be configured to disable or turn off the switch until the ignition system can be serviced, or for a period of time, and then tried again, to determine if the open secondary condition was a temporary condition.

Some Notes

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. In other examples, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A system comprising:
   a switch configured to receive a control signal and to control a flow of current to a primary coil of an ignition coil using the received control signal;
   a controller configured to provide the control signal to the control input of the switch to control the flow of current in the primary coil of the ignition coil; and
   an open secondary detection circuit configured to receive the control signal from the control input of the switch and to detect an open secondary condition in a secondary coil of the ignition coil if the received control signal remains above an open secondary threshold for a predetermined time threshold.

2. The system of claim 1, including a clamp circuit configured to receive an indication of a voltage in the primary coil of the ignition coil and to provide the control signal to the control input of the switch to dissipate energy stored in the primary coil of the ignition coil if the received indication of the voltage in the primary coil exceeds a clamp voltage threshold.

3. The system of claim 2, wherein the clamp circuit includes a zener circuit including at least one zener diode.

4. The system of claim 2, wherein the clamp voltage threshold includes a voltage between approximately 350 and 600 volts.

5. The system of claim 1, wherein the open secondary detection circuit is configured to provide an open secondary signal to the controller if the open secondary condition is detected.

6. The system of claim 5, wherein the controller is configured to inhibit the flow of current through the switch at a subsequent ignition cycle in response to receiving the open secondary signal.

7. The system of claim 1, wherein at least one of the open secondary detection circuit or the controller is configured to provide an indication of the detected open secondary condition to an engine control unit (ECU).

8. The system of claim 1, wherein the switch includes a transistor having a gate, a collector, and an emitter;
   wherein the control input includes the gate, wherein the control signal includes a voltage, and wherein the controller is configured to provide the voltage to the gate of the transistor to allow current to flow between the collector and the emitter, providing current to the primary coil of the ignition coil; and
   wherein the open secondary detection circuit is configured to receive a voltage from the gate of the transistor, and to detect the open secondary condition in the secondary coil of the ignition coil using the received gate voltage.

9. The system of claim 8, wherein the transistor includes an insulated gate bipolar transistor (IGBT).

10. The system of claim 9, wherein the IGBT includes a gate resistor between the gate and the controller, and wherein the open secondary detection circuit is configured to receive the gate voltage through the gate resistor.

11. The system of claim 9, wherein the IGBT includes a gate resistor between the gate and the controller, and wherein the open secondary detection circuit is configured to receive the gate voltage directly from the gate, and not through the gate resistor.

12. The system of claim 1, including the ignition coil having the primary and secondary coils.

13. The system of claim 12, wherein the secondary coil is configured to provide energy to an igniter of an internal combustion engine.

14. The system of claim 1, wherein the controller includes at least one of a processor or a driver circuit.

15. The system of claim 1, wherein the open secondary threshold includes a voltage of approximately 3 volts, and wherein the predetermined time threshold includes a time of approximately 20 microseconds.

16. The system of claim 1, wherein the switch, the controller, the clamp circuit, and the open secondary detection circuit are included in a single integrated package.

17. A system comprising:
   an insulated gate bipolar transistor (IGBT) including a gate, a collector, and an emitter, the IGBT configured to receive a voltage at the gate and to control a flow of current to a primary coil of an ignition coil using the received gate voltage;
   a controller configured to provide a voltage to the gate of the IGBT to control the flow of current in the primary coil of the ignition coil; and
   an open secondary detection circuit configured to receive a voltage from the gate of the IGBT, to detect an open secondary condition in a secondary coil of the ignition coil using the received gate voltage, and to provide an open secondary signal to the controller if the open secondary condition is detected.

18. The system of claim 17, wherein the open secondary detection circuit is configured to detect the open secondary condition if the received gate voltage remains above an open secondary threshold for a predetermined time threshold.

19. The system of claim 18, wherein the open secondary threshold includes a voltage of approximately 3 volts, and wherein the predetermined time threshold includes a time of approximately 20 microseconds.

20. The system of claim 17, including a zener circuit configured to receive an indication of a voltage in the primary coil of the ignition coil and to provide a voltage to the gate of the IGBT to dissipate energy stored in the primary coil of the ignition coil if the received indication of the voltage in the primary coil exceeds a clamp voltage threshold.

21. The system of claim 20, wherein the clamp voltage threshold includes a voltage between approximately 350 and 600 volts.

22. An apparatus comprising:
an open secondary detection circuit configured to receive a gate voltage of an insulated gate bipolar junction transistor (IGBT) configured to control a flow of current to a primary coil of an ignition coil, the open secondary detection circuit configured to detect an open secondary condition in a secondary coil of the ignition coil if the received gate voltage remains above an open secondary threshold for a predetermined time threshold.

23. The apparatus of claim 22, wherein the open secondary threshold includes a voltage of approximately 3 volts, and wherein the predetermined time threshold includes a time of approximately 20 microseconds.

24. A method comprising:
receiving a gate voltage of an insulated gate bipolar transistor (IGBT) configured to control a flow of current to a primary coil of an ignition coil; and
detecting an open secondary condition in a secondary coil of the ignition coil if the received gate voltage remains above an open secondary threshold for a predetermined time threshold.

25. The method of claim 24, wherein the detecting the open secondary condition in the secondary coil of the ignition coil includes detecting an open secondary condition if the received gate voltage remains above an open secondary threshold of approximately 3 volts for a predetermined time threshold of approximately 20 microseconds.

26. The method of claim 24, including:
receiving an indication of voltage in the primary coil of the ignition coil; and
providing a voltage to the gate of the IGBT to dissipate energy stored in the primary coil of the ignition coil if the received indication of the voltage in the primary coil exceeds a clamp voltage threshold.

27. The method of claim 26, wherein the providing the voltage to the gate of the IGBT includes providing a voltage to the gate of the IGBT if the received indication of the voltage in the primary coil exceeds a clamp voltage threshold between approximately 350 and 600 volts.

28. The method of claim 24, including inhibiting the current in the primary coil of the ignition coil if the open secondary condition is detected.

29. The method of claim 24, including providing an indication of the detected open secondary condition to an engine control unit (ECU).

* * * * *